to any disclaimer, the term of thisextended or adjusted under 35(b) by 42 days.

(12) United States Patent
Kohyama et al.

(10) Patent No.: US 6,846,733 B2
(45) Date of Patent: Jan. 25, 2005

(54) STACKED CAPACITOR-TYPE SEMICONDUCTOR STORAGE DEVICE AND MANUFACTURING METHOD THEREOF

(75) Inventors: Yusuke Kohyama, Yokosuka (JP); Takashi Ohsawa, Yokohama (JP); Shizuo Sawada, Urawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 42 days.

(21) Appl. No.: 10/388,462

(22) Filed: Mar. 17, 2003

(65) Prior Publication Data

US 2003/0178686 A1 Sep. 25, 2003

Related U.S. Application Data

(60) Continuation of application No. 09/631,830, filed on Aug. 3, 2000, now Pat. No. 6,551,894, which is a division of application No. 08/720,032, filed on Sep. 27, 1996, now Pat. No. 6,130,450.

(30) Foreign Application Priority Data

Sep. 29, 1995 (JP) ............................... 7-254218

(51) Int. Cl.[7] .................. H01L 21/3205; H01L 21/4763
(52) U.S. Cl. ........................ 438/586; 438/624; 438/639
(58) Field of Search .................................. 438/586, 618, 438/624, 634, 639

(56) References Cited

U.S. PATENT DOCUMENTS

| 4,977,105 A | 12/1990 | Okamoto et al. |
|---|---|---|
| 5,037,777 A | 8/1991 | Mele et al. |
| 5,055,423 A | 10/1991 | Smith et al. |
| 5,061,650 A | 10/1991 | Dennison et al. |
| 5,082,797 A | 1/1992 | Chang et al. |
| 5,200,358 A | 4/1993 | Bollinger et al. |
| 5,275,972 A | 1/1994 | Ogawa et al. |
| 5,279,982 A | 1/1994 | Crotti |
| 5,312,769 A | 5/1994 | Liou et al. |
| 5,466,639 A | 11/1995 | Ireland |
| 5,482,894 A | 1/1996 | Havemann |
| 5,578,524 A | 11/1996 | Fukase et al. |
| 5,631,179 A | 5/1997 | Sung et al. |
| 5,643,833 A | 7/1997 | Tsukamoto |
| 5,667,918 A | 9/1997 | Brainerd et al. |
| 5,828,094 A | 10/1998 | Lee |
| 5,840,621 A | 11/1998 | Kasai |
| 5,841,195 A | 11/1998 | Lin et al. |

FOREIGN PATENT DOCUMENTS

| GB | 2249429 A | 5/1992 |
|---|---|---|
| JP | 03-064964 A | 3/1991 |
| JP | 03-108359 A | 5/1991 |
| JP | 06-005714 A | 1/1994 |
| JP | 06-037273 A | 2/1994 |
| JP | 06-061361 A | 3/1994 |
| JP | 06-120447 A | 4/1994 |
| JP | 06-338597 A | 12/1994 |

*Primary Examiner*—Matthew Smith
*Assistant Examiner*—Lex H. Malsawma
(74) *Attorney, Agent, or Firm*—Banner & Witcoff, Ltd.

(57) ABSTRACT

First and second wirings are formed on a first insulating film. Each of the wirings is arranged so that a conductive film, a silicon oxide film and a silicon nitride film are laminated. Thereafter, a silicon oxide insulating film is formed on the whole surface. The silicon oxide insulating film is etched so that a contact hole is formed between the first and second wirings. Since the silicon oxide film and the silicon nitride film exist on the conductive film of each wiring, the conductive film is not exposed at the time of etching. Thereafter, an insulating film is formed on a side wall of the contact hole, and the conductive film exposed through the contact hole is covered by the insulating film.

14 Claims, 13 Drawing Sheets

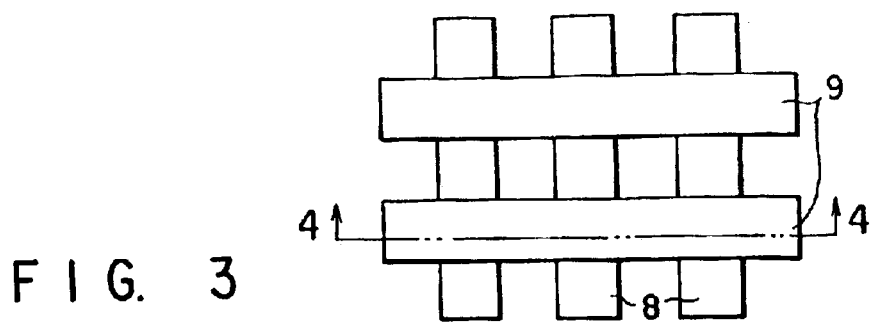
F I G. 3
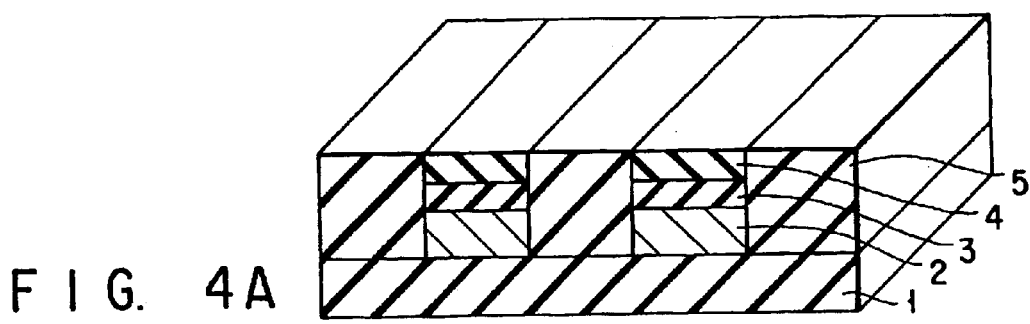
F I G. 4A
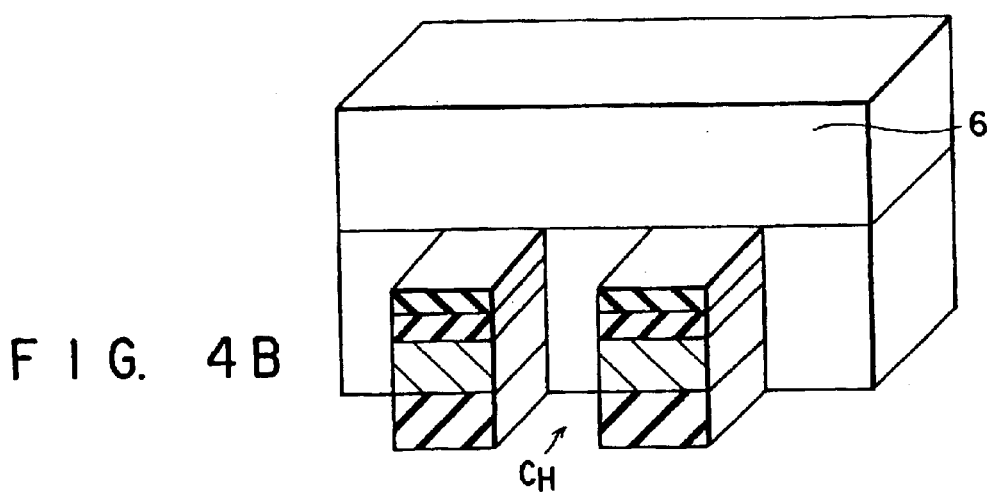
F I G. 4B
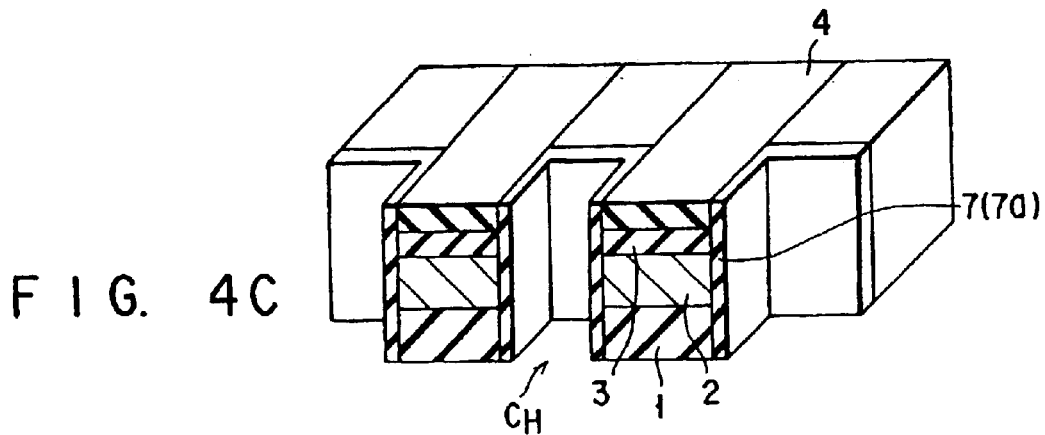
F I G. 4C

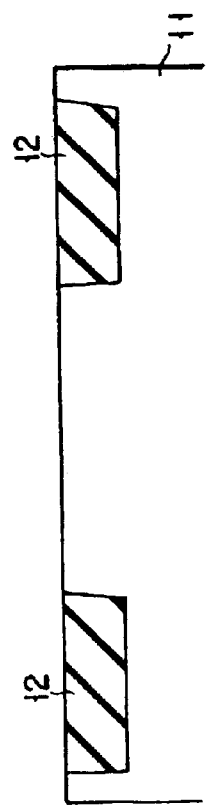
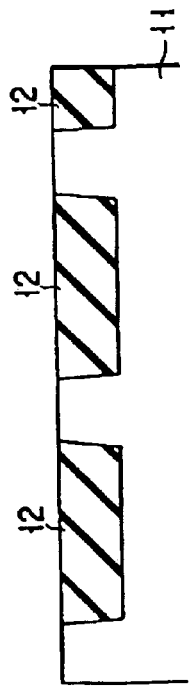
FIG. 6A
FIG. 7A
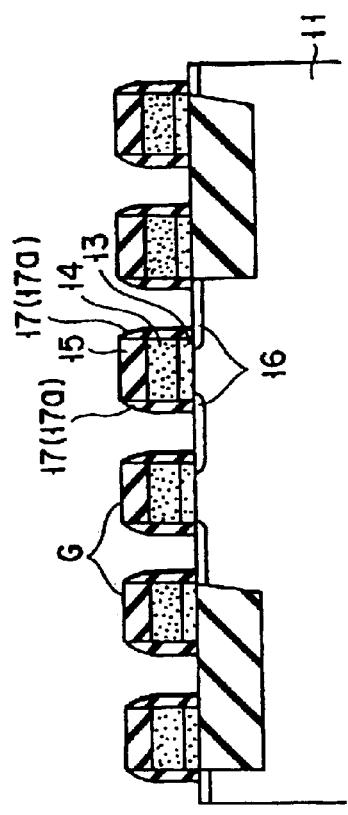
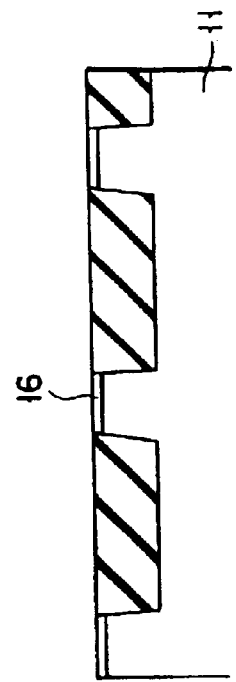
FIG. 6B
FIG. 7B
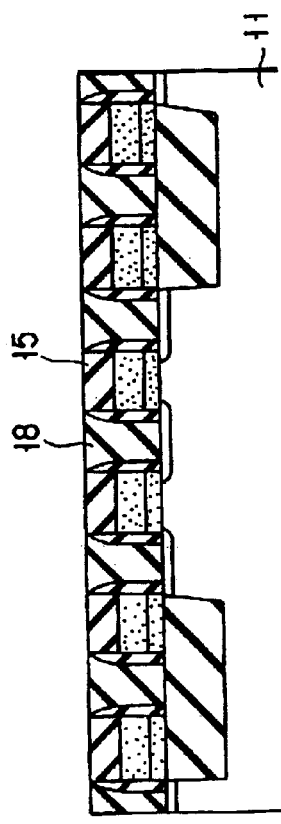
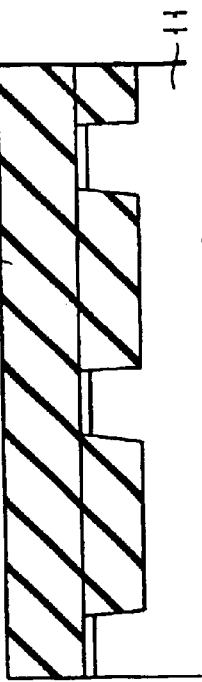
FIG. 6C
FIG. 7C

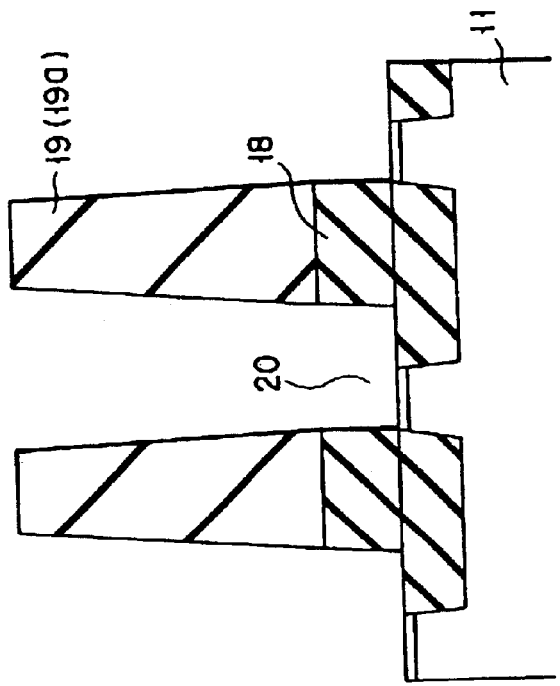
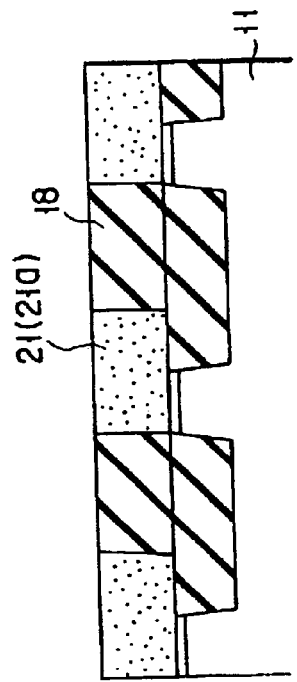
FIG. 6D
FIG. 7D
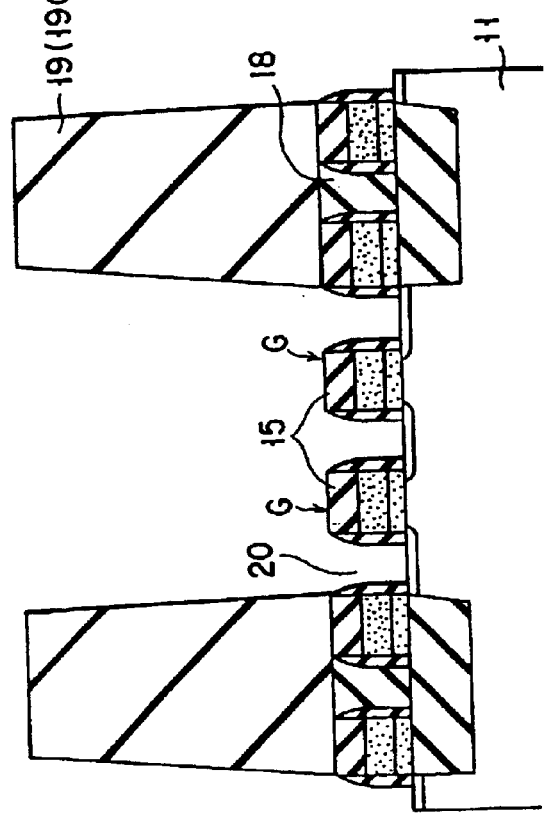
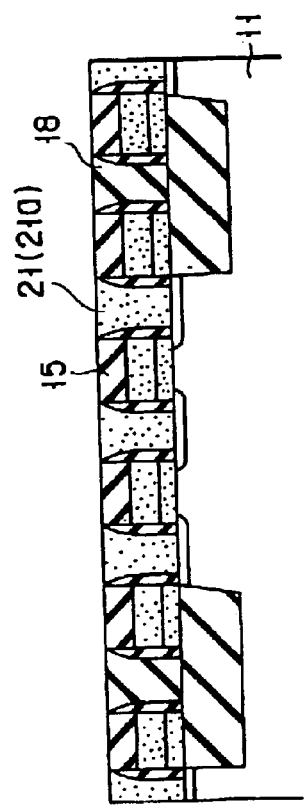
FIG. 6E
FIG. 7E

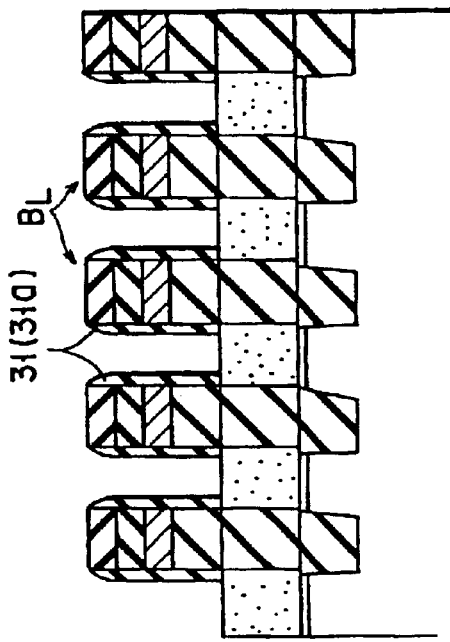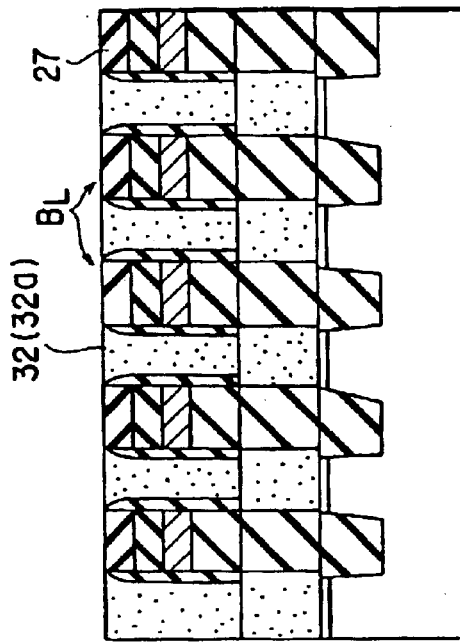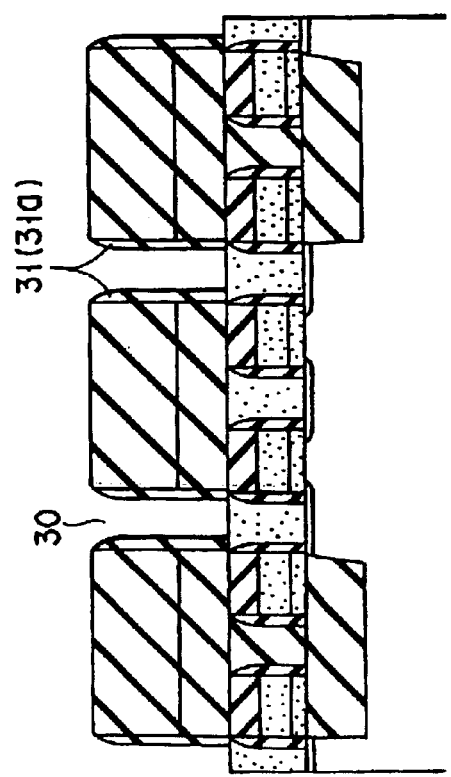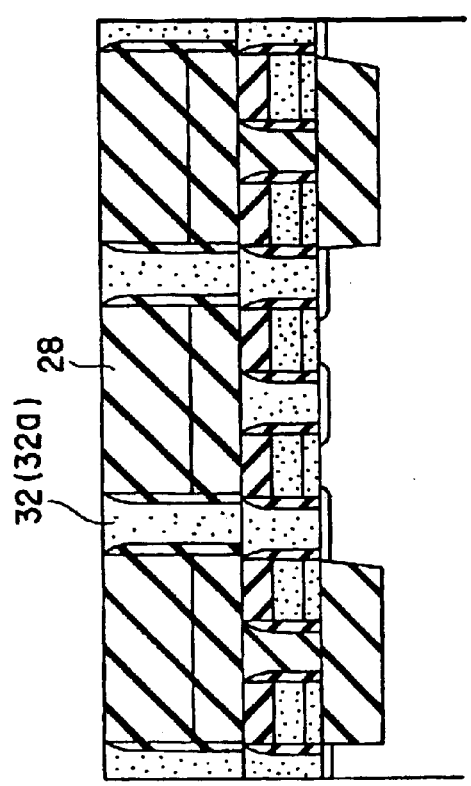

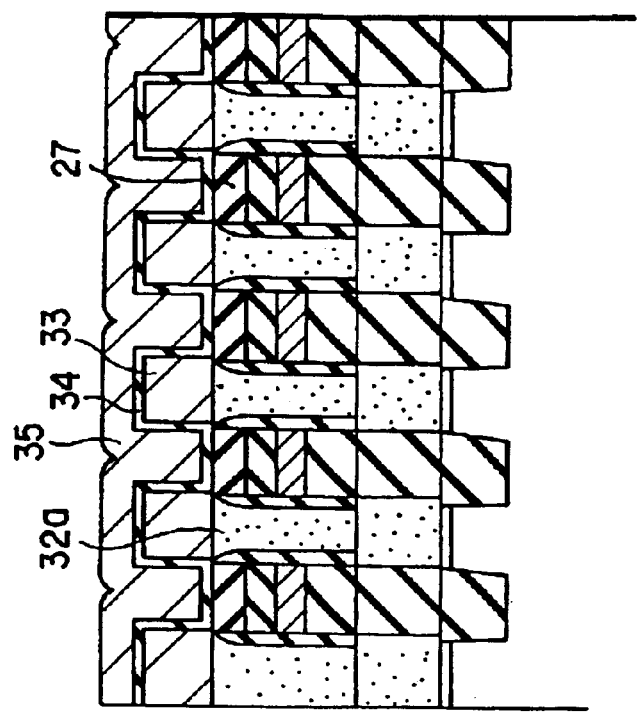
F I G. 9E
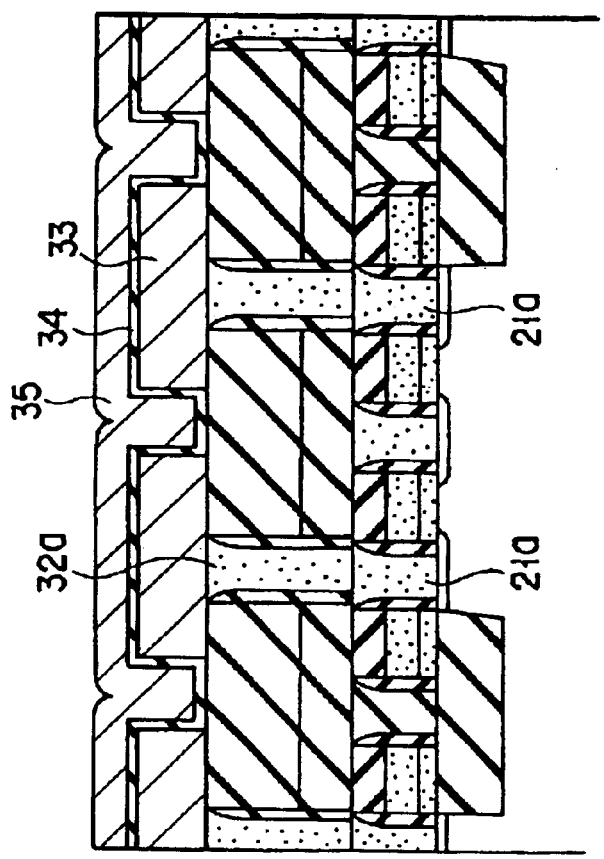
F I G. 6J

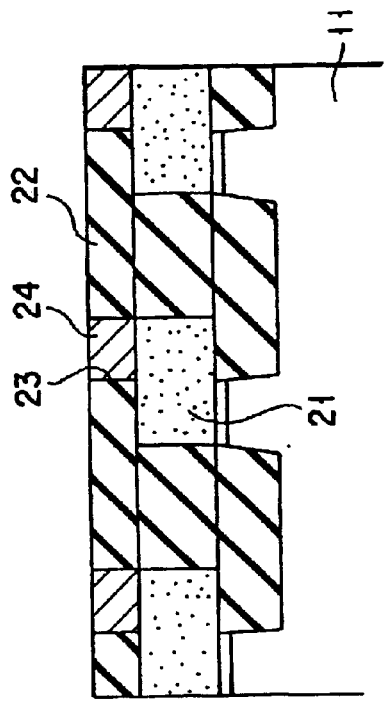
F I G. 7F
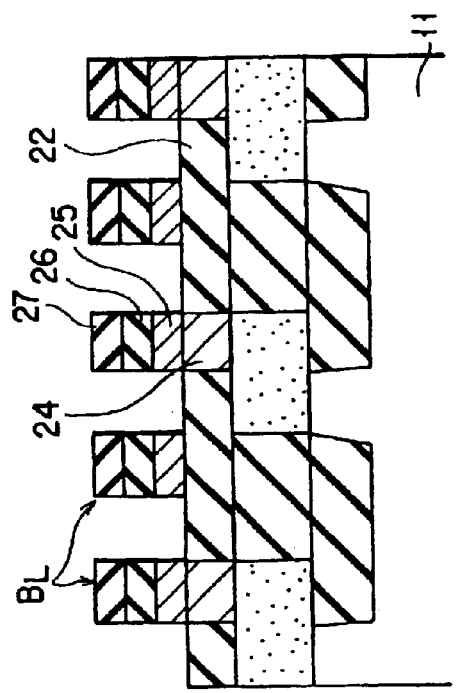
F I G. 7G
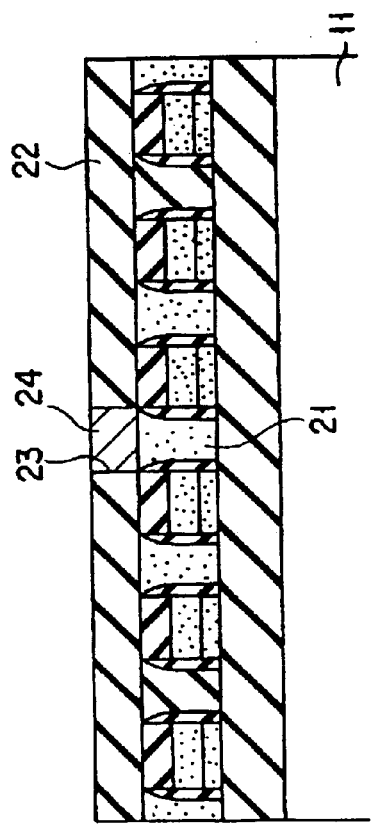
F I G. 8A
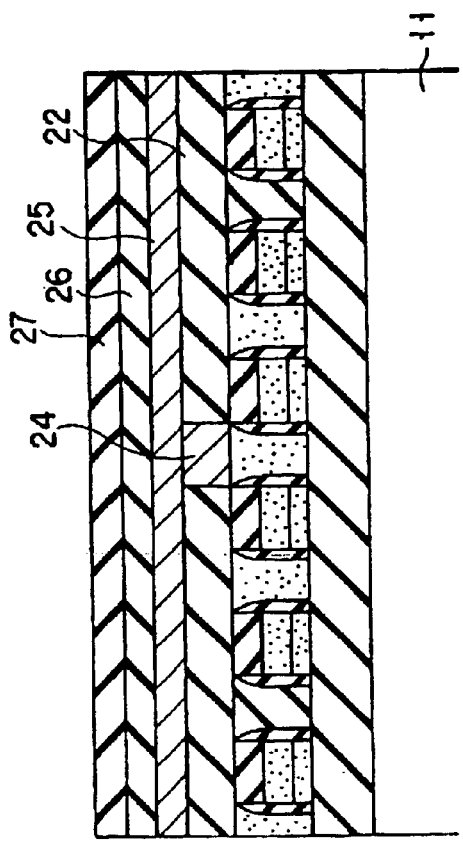
F I G. 8B

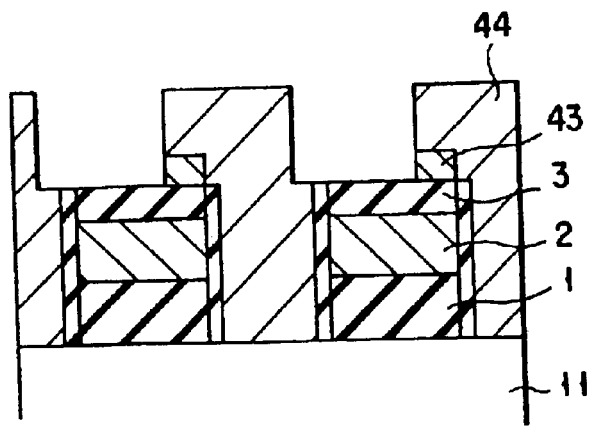
F I G. 12

STACKED CAPACITOR-TYPE SEMICONDUCTOR STORAGE DEVICE AND MANUFACTURING METHOD THEREOF

CROSS-REFERENCE TO RELATED APPLICATIONS

This application is a continuation of U.S. patent application Ser. No. 09/631,830, filed Aug. 3, 2000 (now U.S. Pat. No. 6,551,894), which is a divisional of U.S. patent application Ser. No. 08/720,032, filed Sep. 27, 1996 (now U.S. Pat. No. 6,130,450), which is based upon and claims the benefit of priority from prior Japanese Patent Application No.7-254218, filed Sep. 29, 1995, the entire contents of which are incorporated herein by reference.

BACKGROUND OF THE INVENTION

1. Field of the Invention

The present invention relates to a cell structure of dynamic RAM (i.e. DRAM), for example, more specifically, a STC (Stacked Capacitor)-type semiconductor storage device in which a memory cell capacitor is formed above a bit line so as to be self-aligned with the bit line, and relates to a manufacturing method thereof.

2. Description of the Related Art

Recently, a semiconductor storage device, particularly, a DRAM has been integrated greatly. Accordingly, a percentage of a unit storage element is showing a tendency to further increase. For this reason, a three-dimensional memory cell capacitor and a three-dimensional memory cell transistor are indispensable for obtaining enough capacity (not less than 20 fF) to read/write. As a result, a cell structure using a trench-type capacitor or STC-type capacitor is generally used.

In addition, in the cell using the STC-type capacitor, a technique for forming a memory cell capacitor so that it is self-aligned with a bit line is important to greater-scale integration. As a method of manufacturing the conventional STC-type capacitor, a memory cell is suggested as described in, for example, M. Fukumoto et al., "Stacked capacitor cell technology for 16 M DRAM using double self aligned contacts", ESSDERC 90, pp. 461–464, 1990. FIGS. 13 through 15 show its example.

FIG. 13 shows a plan view of the memory cell. In FIG. 13, 201 is a channel region, 202 is a gate electrode pattern, 203 is a bit line contact, 204 is a bit line pattern, 205 is a storage node contact pattern, and 206 is a storage node electrode pattern.

FIGS. 14A through 14C show manufacturing steps of a cross-sectional view taken along line 14—14 in FIG. 13. As shown in FIG. 14A, an element separating oxide film 52, a MOS transistor for transmitting data, not shown, a first inter-layer insulating film 53, a bit line contact, not shown, a bit line 54, and a second inter-layer insulating film 55 made of BPSG film are formed on a semiconductor substrate 51. Next, a storage node contact 56 which reaches the semiconductor substrate 51 is formed in the first and second inter-layer insulating films 53 and 55 which is located between the bit lines 54—54 by the known lithography method and the RIE (Reactive Ion Etching) method.

Next, as shown in FIG. 14B, an HTO (High Temperature Oxide) film 57 is deposited over the whole surface, and the whole surface is etch-backed by the RIE method. Then, as shown in FIG. 14C, a side wall spacer 58 constituted by the HTO film 57 is formed on the first and second inter-layer insulating films exposed in the storage node contact 56.

If the storage node contact pattern 205 shown in FIG. 13 is not aligned with the bit line pattern 204, the following problems arise. As shown in FIG. 15A, when the storage node contact 56 is formed, the bit line 54 is exposed from the first and second inter-layer insulating films 53 and 55. In this state, as shown in FIG. 15B, the HTO film 57 is deposited on the whole surface, the whole surface is etch-backed by the RIE method. Then, as shown in FIG. 15C, the side wall spacer 58 is formed in the storage node contact 56 so as to be on the bit line 54 and the side wall of the second inter-layer insulating film 55. However, since a part of the bit line 54 is exposed from a gap of the side wall spacer 58, the storage node, not shown, which is formed later and the bit line 54 are short-circuited.

In addition, when the whole surface of the HTO film 57 is etch-backed, since the HTO film 57 and the second inter-layer insulating film 55 are made of silicon oxide, sufficient selectivity cannot be obtained. Therefore, it becomes difficult to control thicknesses of the insulating film on the bit line 54 and the second inter-layer insulating film 55.

Furthermore, when the storage node contact 56 is formed, since a contact opening and a contact gap are minute, it is difficult to form a resist pattern. Moreover, the storage node contact 56 does not have a desired shape, i.e. square shape, and as shown by broken lines in FIG. 13, it has a circular shape. The circular shape has a diameter which is a minimum dimension of the diameter when the storage node contact 56 is inscribed in a square pattern. The contact area decreases, thereby increasing contact resistance. Moreover, since the storage node contact 56 reaches the semiconductor substrate 51, an aspect ratio becomes large. As a result, the yield of the contact opening is not efficient, and thus it is difficult to plug up the storage node.

SUMMARY OF THE INVENTION

It is an object of the present invention to provide a semiconductor storage device which is capable of preventing a short-circuit of a contact and a wiring, forming the contact so that the contact is self-aligned, and securely controlling a thickness of a film formed on the wiring, forming a fine contact with an excellent yield of an opening of the contact, and filling up the contact, and relates to a manufacturing method thereof.

In order to achieve the above object, a semiconductor storage device of the present invention comprises:

a first insulating film formed on a semiconductor substrate;

first and second wirings arranged on the first insulating film at a predetermined interval, the first and second wirings composed of a conductive film, and a second insulating film on the conductive film;

a contact hole formed between the first and second wirings, and on the first insulating film between the first and second wirings; and a third insulating film formed in the contact hole, the third insulating film being formed at least on a side wall of the conductive film and a side wall of the first insulating film.

In addition a method of manufacturing a semiconductor storage device comprises the steps of:

forming a first insulating film on a semiconductor substrate;

forming a conductive film on the first insulating film;

forming a protective film on the conductive film;

etching the protective film and conductive film locally and forming first and second wirings;

forming a second insulating film between the first and second wirings;

etching the second insulating film and first insulating film locally by using the protective film as a mask and forming a contact hole between the first and second wirings; and forming a third insulating film at least on a side wall of the conductive film and on a side wall of the first insulating film in the contact hole.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a plan view which shows a mask pattern which is applied to a third embodiment of the present invention;

FIGS. 4A through 4C show the third embodiment of the present invention, more specifically, they are cross sectional views taken along a line 4—4 in FIG. 3;

FIGS. 6A through 6J show the steps of manufacturing according to the fourth embodiment of the present invention, more specifically they are cross-sectional views taken along a line 6—6 in FIG. 5;

FIGS. 7A through 7G show the steps of manufacturing according to the fourth embodiment of the present invention, more specifically they are cross-sectional views taken along a line 7—7 in FIG. 5;

FIGS. 8A and 8B show the steps of manufacturing according to the fourth embodiment of the present invention, more specifically they are cross-sectional views taken along a line 8—8 in FIG. 5;

FIGS. 9A through 9E show the steps of manufacturing according to the fourth embodiment of the present invention, more specifically they are cross-sectional views taken along a line 9—9 in FIG. 5;

FIG. 12 is a cross-sectional view which shows a seventh embodiment of the present invention;

DETAILED DESCRIPTION OF THE PREFERRED EMBODIMENTS

The following describes embodiments of the present invention with reference to the drawings.

Figure 1A:
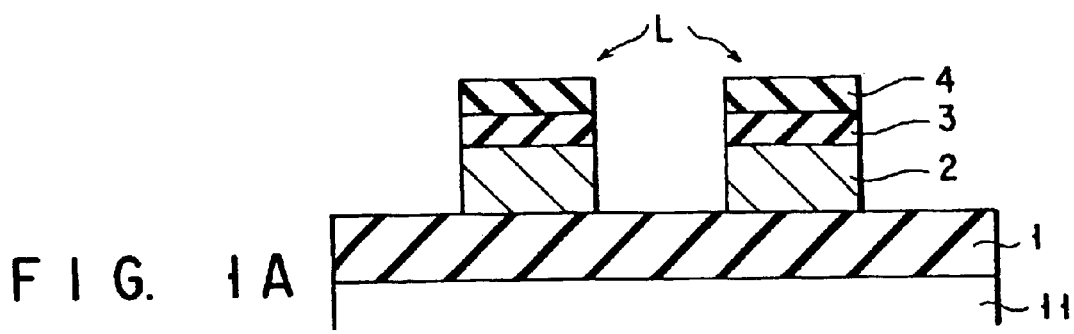
FIGS. 1A through 1D are cross-sectional views which show a first embodiment of the present invention, more specifically, the step of manufacturing of a semiconductor device.

FIGS. 1A through 1D show the first embodiment of the present invention. As shown in FIG. 1A, a first insulating film 1 made of silicon oxide is formed on a semiconductor substrate 11. A conductive film 2, such as tungsten (W), a second insulating film 3 made of silicon oxide, and a third insulating film 4 made of silicon nitride are formed on the first insulating film 1. Thereafter, the third insulating film 4, the second insulating film 3 and the conductive film 2 are patterned by using a desired wiring pattern so that a wiring L is formed.

Figure 1B:
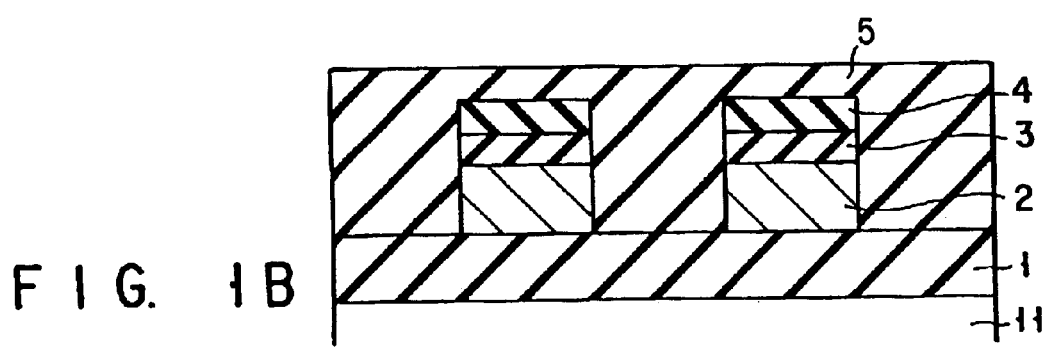
Figure 1C:
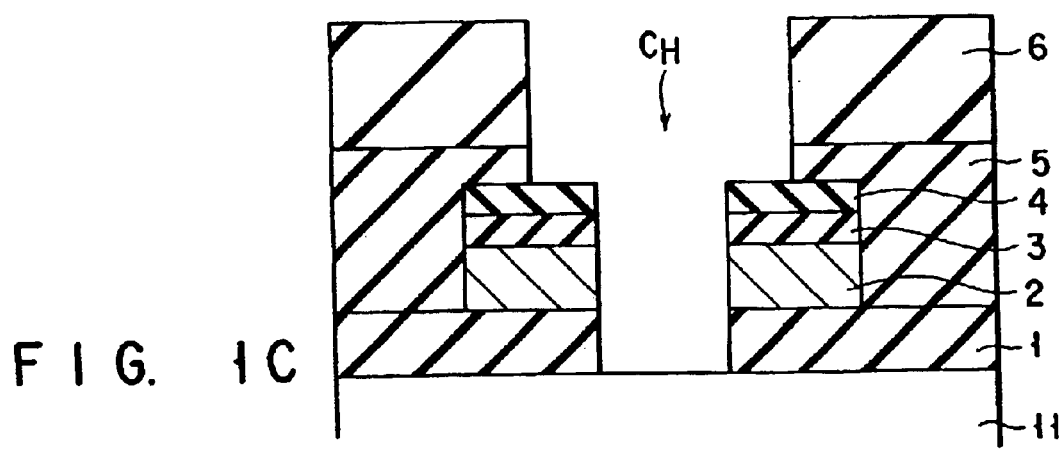

Next, as shown in FIG. 1B, a fourth insulating film 5 made of silicon oxide is deposited on the whole surface, and the surface is planarized by the CMP (Chemical Mechanical Polishing) method. As shown in FIG. 1C, a photo-resist 6 is formed on the fourth insulating film 5 by using a desired contact hole pattern. The fourth and first insulating films 5 and 1 are etched by the RIE method under an etching condition that a selectivity to the fourth and first insulating films 5 and 1 and the third insulating film 4 is high, and then a contact hole CH is formed.

Figure 1D:
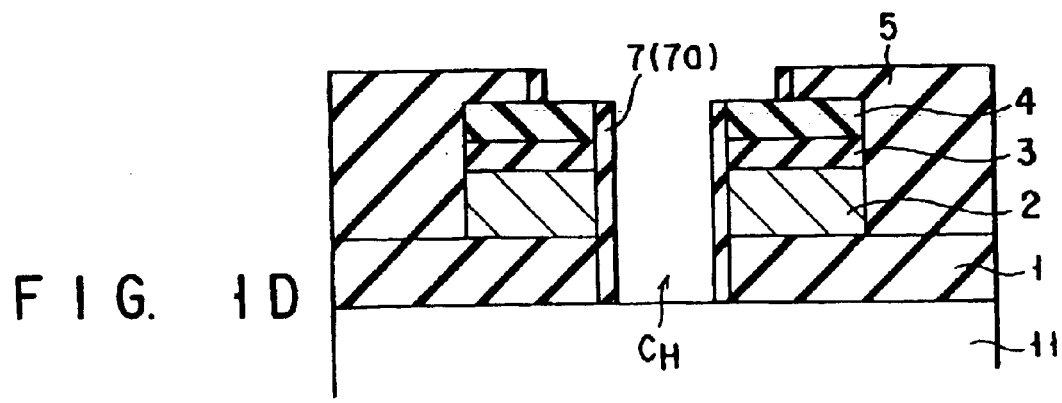

Next, the resist 6 is removed, and the fifth insulating film 7 is deposited on the whole surface. The fifth insulating film 7 is etch-backed by the RIE method, and as shown in FIG. 1D, a side wall spacer 7a composed of the fifth insulating film 7 is formed on a side wall of the contact hole CH. The side wall spacer 7a is formed on side walls of the first insulating film 1, the conductive film 2, the second insulating film 3, the third insulating film 4 and the fourth insulating film 5.

Since the conductive film 2 is protected by the third insulating film 4, at the timing of etching it by the RIE method, even if alignment is not obtained on a mask, the conductive film 2 is not exposed. Therefore, even when a conductive layer is formed in the contact hole CH, a short-circuit between the conductive film 2 and the conductive layer can be prevented.

Figure 2A:
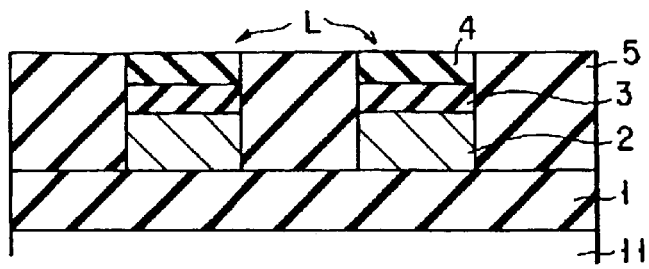
FIGS. 2A through 2C are cross-sectional views which show a second embodiment of the present invention, more specifically, the step of manufacturing of a semiconductor device.
Figure 2B:
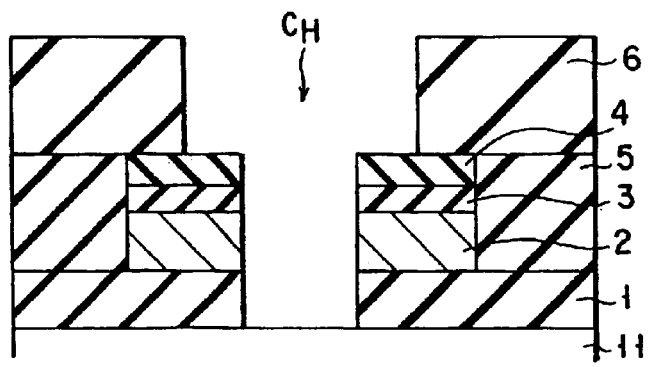
Figure 2C:
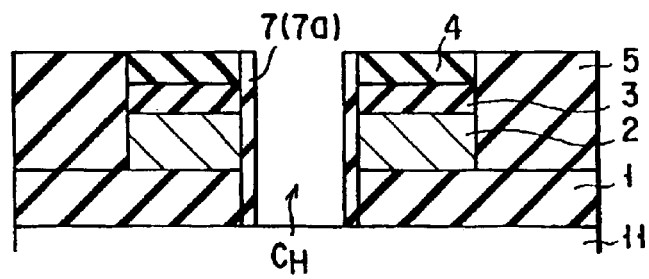

FIGS. 2A through 2C show a second embodiment of the present invention. Here, the parts described in the first embodiment are indicated by the same reference numerals. The manufacturing steps up to the formation of a desired wiring L are the same as the first embodiment. After the wiring L is formed, the fourth insulating film 5 is deposited on the whole surface, and as shown in FIG. 2A, the surface of the fourth insulating film 5 is planarized by the CMP method. At this time, the fourth insulating film 5 is planarized with the upper surface of the third insulating film 4 by using the third insulating film 4 as a stopper of CMP.

Next, the photo-resist 6 is formed by using a desired contact hole pattern. As shown in FIG. 2B, the fourth and first insulating films 5 and 1 are etched by the RIE method under the etching condition that the selectivity to the fourth and first insulating films 5 and 1 and the third insulating film 4 is high. Then, the contact hole CH is formed.

After the resist 6 is removed, the fifth insulating film 7 is deposited on the whole surface. When the whole surface of the fifth insulating film 7 is etch-backed by the RIE method, as shown in FIG. 2C, the side wall spacer 7a composed of the fifth insulating film 7 is formed on the side wall of the contact hole.

Also in this embodiment, the conductive film 2 is protected by the third insulating film 4. For this reason, at the time of etching by the RIE method, even if the alignment is not obtained on a mask, the conductive film 2 is not exposed. Therefore, even when a conductive layer is formed in the contact hole CH, the short-circuit between the conductive film 2 and the conductive layer can be prevented. Moreover, since a thickness of the insulating film on the conductive film 2 is defined by the thicknesses of the second and third insulating films, controllability is satisfactory.

In the first and second embodiments, the material of the fifth insulating film 7 is, for example, silicon nitride film, silicon oxide film, or a composite film of a silicon nitride film and a silicon oxide film. A dielectric constant of the fifth insulating film 7 is set smaller than a silicon nitride film.

FIGS. 3 and 4A through 4C show a third embodiment of the present invention, and the parts described in the first and second embodiments are indicated by the same reference numerals. In FIGS. 4A through 4C, the semiconductor substrate is omitted. As shown in FIGS. 1A and 2A, the manufacturing steps up to the formation of the wiring L are the same as the first and second embodiments. The wiring L is formed by using a strip-like wiring pattern 8 shown in FIG. 3. Thereafter, the fourth insulating film 5 made of silicon oxide is deposited on the whole surface, and as shown in FIG. 4A, the fourth insulating film 5 is planarized with the upper surface of the third insulating film 4 by the CMP method.

Next, the photo-resist 6 shown in FIG. 4B is formed by using a linear/space contact hole pattern 9 which intersects perpendicularly to the wiring pattern 8 as shown in FIG. 3. Then, the fourth and first insulating films 5 and 1 are etched by the RIE method under the etching condition that the selectivity to the fourth and first insulating films 5 and 1 and the third insulating film 4 is high, and a contact hole is formed between the wirings.

Next, the resist 6 is removed, and the fifth insulating film 7 is deposited on the whole surface. Then, the fifth insulating film 7 is etch-backed by the RIE method so that, as shown in FIG. 4C, the side wall spacer 7a is formed in the contact hole CH by the fifth insulating film 7. The widths of wiring pattern 8 and the contact hole pattern 9 are set to a minimum dimension which is defined by the design rule.

In this embodiment, since the conductive film 2 is protected by the third insulating film 4, at the time of etching by the RIE method, even if the alignment is not obtained on the mask, the conductive film 2 is not exposed. Therefore, even when a conductive layer is formed in the contact hole CH, the short-circuit between the conductive film 2 and the conductive layer can be prevented. Moreover, since the thickness of the insulating film on the conductive film 2 is defined by the thickness of the second and third insulating film, controllability is satisfactory. Moreover, since the contact hole pattern 9 has a linear/space shape, the contact hole can be easily formed. Further, when the linear/space contact hole pattern is used, the contact hole has a square shape whose side has a minimum dimension defined by the design rule. Therefore, since the contact hole does not have a circular shape which is inscribed in a square shape having a minimum dimension side unlike the conventional manner, the contact area can be made larger, thereby decreasing the contact resistance.

The following describes a fourth embodiment of the present invention with reference to FIG. 5, FIGS. 6A through 6J, FIGS. 7A through 7G, FIGS. 8A and 8B, and FIGS. 9A through 9E. The fourth embodiment relates to a case where the present invention is applied to a method of manufacturing the STC-type DRAM cell.

Figure 5:
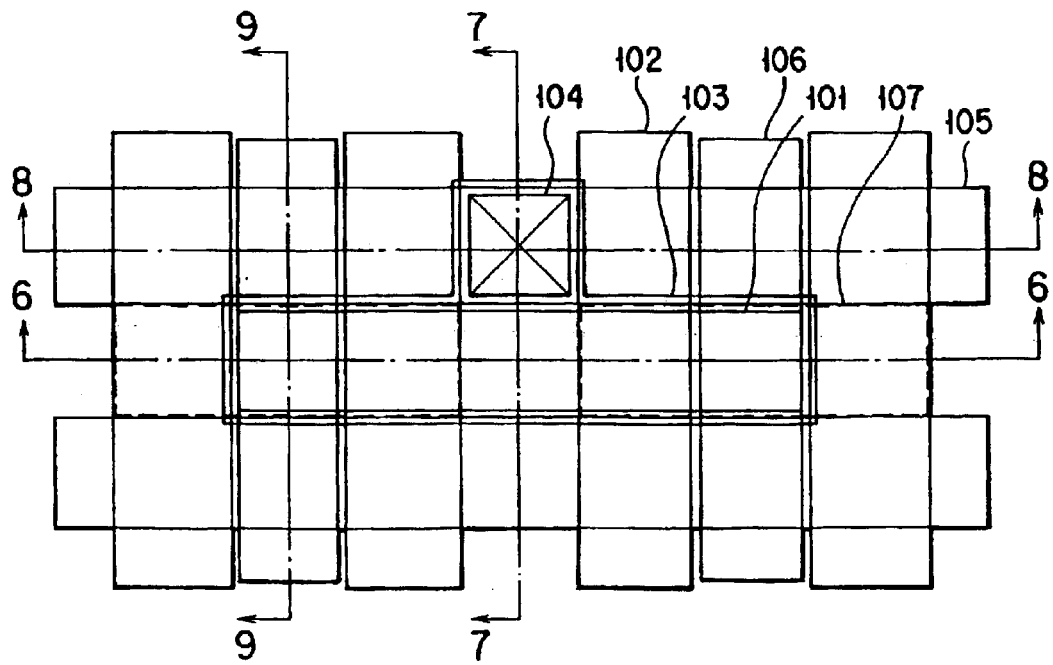
FIG. 5 is a plan view which shows a mask pattern which is applied to a fourth embodiment of the present invention.
Figure 6F:
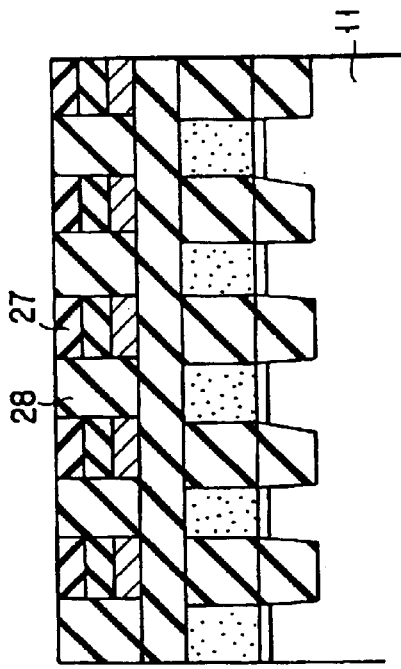
Figure 9A:
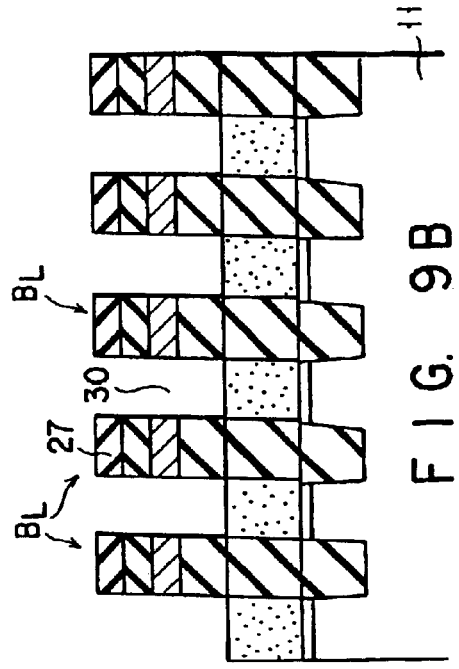
Figure 6G:
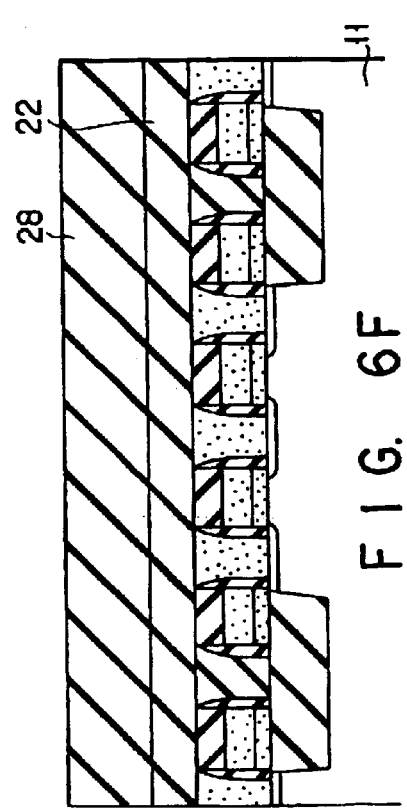
Figure 9B:
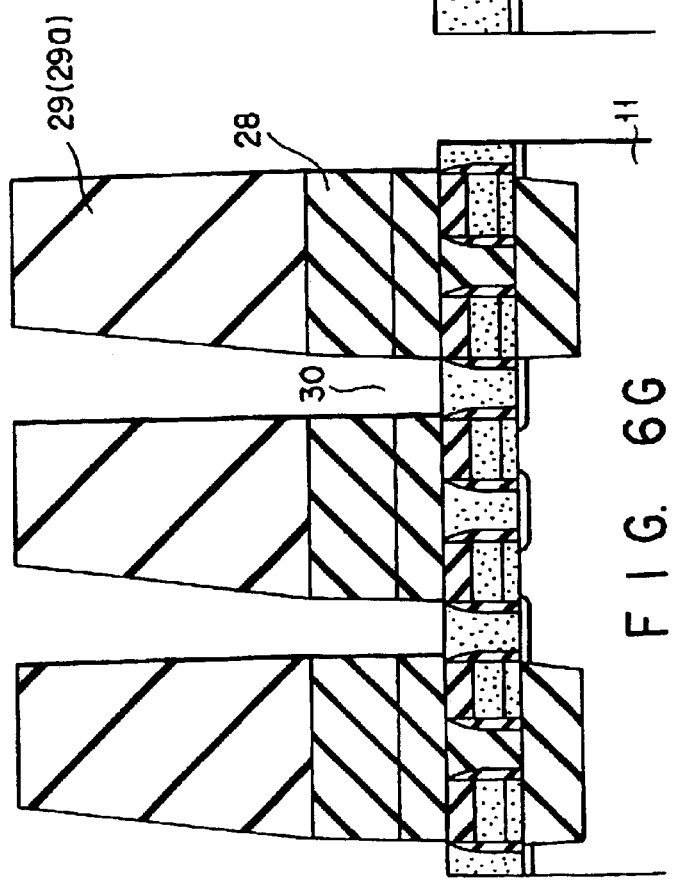

FIG. 5 is a plan view which shows a mask pattern applied to the fourth embodiment, and FIGS. 6A through 6J, FIGS. 7A through 7G, FIGS. 8A and 8B, FIGS. 9A through 9E show the steps of manufacturing according to the fourth embodiment. Namely:

FIGS. 6A and 7A show the first step;
FIGS. 6B and 7B show the second step;
FIGS. 6C and 7C show the third step;
FIGS. 6D and 7D show the fourth step;
FIGS. 6E and 7E show the fifth step;
FIGS. 8A and 7F show the sixth step;
FIGS. 8B and 7G show the seventh step;
FIGS. 6F and 9A show the eighth step;
FIGS. 6G and 9B show the ninth step;
FIGS. 6H and 9C show the tenth step;
FIGS. 6I and 9D show the eleventh step; and
FIGS. 6J and 9E show the twelfth step.

In FIG. 5, 101 represents an element separating pattern for forming an element separating region, 102 represents a gate electrode pattern for forming a gate electrode, 103 represents a plug pattern for forming a plug, 104 represents a bit line contact pattern for forming a bit line contact, 105 represents a bit line pattern for forming a bit line, 106 represents a storage node contact pattern for forming a storage node contact, and 107 represents a storage node electrode pattern for forming a storage node electrode.

As shown in FIGS. 6A and 7A, an element separating oxide film 12 is formed on the semiconductor substrate 11 by using the STI (Shallow Trench Isolation) technique and using the element separating pattern 101 show in FIG. 5 as a mask.

Next, a gate oxide film, not shown, is formed on the semiconductor substrate 11. As shown in FIGS. 6B and 7B, an N-type polysilicon film 13, a tungsten silicide film 14 and a silicon nitride film 15 are deposited on the gate oxide film in this order. Thereafter, the silicon nitride film 15 and the tungsten silicide film 14 and the N-type polysilicon film 13 are patterned by using the gate electrode pattern 102 shown in FIG. 5, and a MOSFET gate electrode G is formed. Next, ions of N-type impurity such as As are implanted into the semiconductor substrate 11 on the gate oxide film so that a source/drain diffusion layer 16 is formed. Thereafter, a silicon nitride film 17 is deposited on the whole surface, and the silicon nitride film 17 is etch-backed so that a side wall spacer 17a composed of the silicon nitride film is formed on the side wall of the gate electrode G.

Next, as shown in FIGS. 6C and 7C, a BPSG film 18 is deposited on the whole surface, and the surface of the BPSG film 18 is planarized by using the CMP method and using the silicon nitride film 15 as the stopper. Then, as shown in FIGS. 6D and 7D, a resist 19 is applied to the whole surface, and an etching mask 19a is formed by using the plug pattern 103 shown in FIG. 5 and using the lithography method. The BPSG film 18 is etched by using the RIE method and using the etching mask 19a and the silicon nitride film 15 as the mask under the etching condition that the selectivity to the BPSG film 18 and the silicon nitride film 15 is high. With this step, the contact hole 20 is formed so as to be self-aligned with the gate electrode G.

Next, after the resist 19 is removed, as shown in FIGS. 6E and 7E, an N-type polysilicon film 21 is deposited on the whole surface. Thereafter, the surface of the N-type polysilicon film 21 is planarized by using the CMP method and using the silicon nitride film 15 and the BPSG film 18 as a stopper. At the same time, a plug 21a is formed in the contact hole 20 by the N-type polysilicon film 21.

As shown in FIG. 8A and 7F, a BPSG film 22 is deposited on the whole surface, and a contact hole 23 is formed by using the bit line contact pattern 104 shown in FIG. 5. The position of the contact hole 23 corresponds to the aforementioned contact hole 20. Next, a tungsten film 24 is selectively grown on the exposed N-type polysilicon thin film 21 so that the contact hole 23 is plugged up with the tungsten film 24.

A glue layer, not shown, is formed on the whole surface, and as shown in FIGS. 8B and 7G, a tungsten film 25, a silicon oxide film 26 and a silicon nitride film 27 are deposited in this order. Therefore, the silicon nitride film 27, the silicon oxide film 26, the tungsten film 25 and the glue layer are patterned by using the bit line pattern 105 shown in FIG. 5 so that a bit line BL connected to the plug 21 is formed.

Next, as shown in FIGS. 6F and 9A, a silicon oxide film 28 is deposited on the whole surface, and the surface of the silicon oxide film 28 is planarized by using the CMP method and using the silicon nitride film 27 as a stopper. Then, a resist 29 is applied to the whole surface, and as shown in FIG. 6G, an etching mask 29a is formed by using the lithography method and using the storage node contact pattern 106 shown in FIG. 5. Thereafter, the silicon oxide film 28 is etched by using the RIE method and using the etching mask 29a and the silicon nitride film 27 as a mask. The etching condition in this case is such that the selectivity of the silicon oxide film 28 and the silicon nitride film 27 is high. With this step, a contact hole 30 is formed so as to be self-aligned with the bit line BL.

After the resist 29 is removed, as shown in FIGS. 6H and 9C, a silicon oxide film 31 is deposited on the whole surface. Thereafter, a side wall spacer 31a composed of the silicon oxide film 31 is formed on the side wall of the contact hole 30 by using the etch-back method. As shown in FIGS. 6I and 9D, an N-type polysilicon film 32 is deposited on the whole surface, and the surface of the N-type polysilicon film 32 is planarized by using the CMP method and using the silicon nitride film 27 and the silicon oxide film 28 as a stopper. At the same time, a plug 32a is formed in the contact hole 30 by the N-type polysilicon film 32.

Next, as shown in FIGS. 6J and 9E, a ruthenium film 33 is deposited on the whole surface by the sputtering method, and it is patterned by using the storage node electrode pattern 107 shown in FIG. 5. Thereafter, a high dielectric film such as a BST (Barium Strontium Titanate) film 34 and a ruthenium film 35 are deposited on the whole surface, and a storage capacitor is formed. Then, a wiring layer, etc., not shown, is formed by a known method, and thus the DRAM is finished.

In accordance with the fourth embodiment, in the STC-type DRAM cell, the bit line is protected by a silicon nitride insulating film. For this reason, even if the storage node contact pattern is not aligned with the bit line pattern, exposure of the bit line can be prevented at the time of etching. Moreover, since the insulating film on the bit line is defined by its thickness, the controllability is satisfactory.

In addition, since the storage node contact pattern has a line/space shape, the storage node contact can be prevented from becoming round, thereby making it possible to make the shape of the storage node contact a square whose side has a minimum dimension. Therefore, the contact area can be made large, thereby decreasing the contact resistance.

In addition, since the storage node contact does not reach the substrate and it is connected to the source/drain domain through the conductive plug, an aspect ratio can be lowered. Therefore, the storage node can be easily plugged up, and thus the yield of the contact opening can be improved.

Furthermore, when the silicon oxide insulating film is used as the side wall spacer, the capacity of the bit line can be prevented from increasing, thereby increasing the operating speed and decreasing current consumption.

Figure 10A:
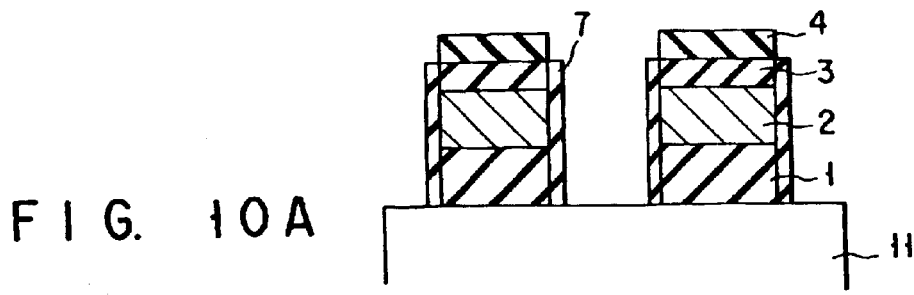
FIGS. 10A and 10B are cross-sectional views which show the steps of manufacturing according to a fifth embodiment of the present invention.
Figure 10B:
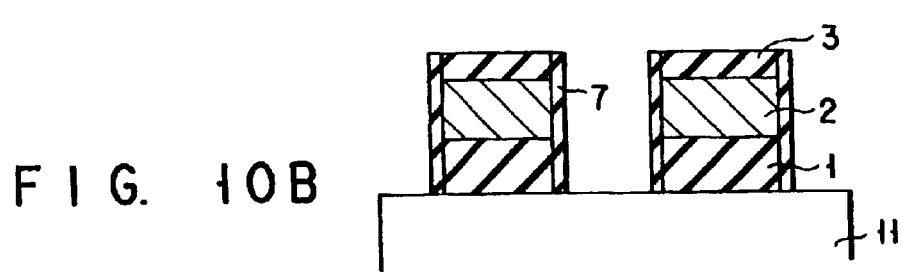

FIGS. 10A and 10B show a fifth embodiment of the present invention. Here, the parts shown in FIGS. 1A through 4C are indicated by the same reference numerals, and only parts not shown in FIGS. 1A through 4C are described. In the second and third embodiments, the second insulating film 3 and the third insulating film 4 (in the fourth embodiment, the silicon oxide film 26 and the silicon nitride film 27) are provided on the conductive layer 2. The material of the third insulating film 4 (in the fourth embodiment, the silicon nitride film 27) has the following conditions:

(1) when the silicon oxide film is subject to RIE, the selectivity with the silicon oxide film is large;

(2) when the silicon oxide film is subject to CMP, the selectivity with the silicon oxide film is large;

(3) when the plug is subject to CMP, the selectivity with the plug is large; and (4) an insulating film.

However, as mentioned above, the third insulating film 4 (in the fourth embodiment, the film 27) is composed of the silicon nitride film. The silicon nitride film has a large capacity and decreases the speed of signal transfer through the wiring. Therefore, it is desirable to remove the silicon nitride film.

Therefore, in the fifth embodiment, when the fifth insulating film 7 is etch-backed, the etching time is made slightly longer, and as shown in FIG. 10A, the fifth insulating film 7 formed on the side wall of the third insulating film 4 is removed. Thereafter, as shown in FIG. 10B, the third insulating film 4 is removed by the process using thermal phosphoric acid. The same effects as the first through fourth embodiments can be obtained in the present embodiment, and a decrease in the speed of signals transfer through the wiring can be obtained. In such a manner, when the third insulating film is removed, the above-mentioned conditions (3) and (4) are not necessary. The present embodiment explains the case of the silicon nitride film, but a conductive film such as polysilicon may be used.

Figure 11A:
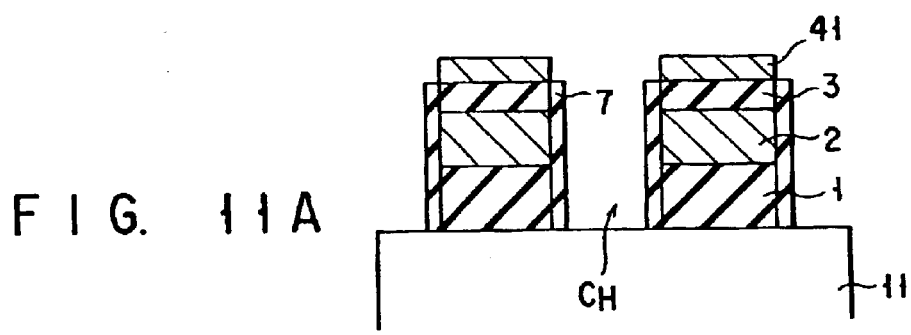
FIGS. 11A through 11C are cross-sectional views which show the steps of manufacturing according to a sixth embodiment of the present invention.
Figure 11B:
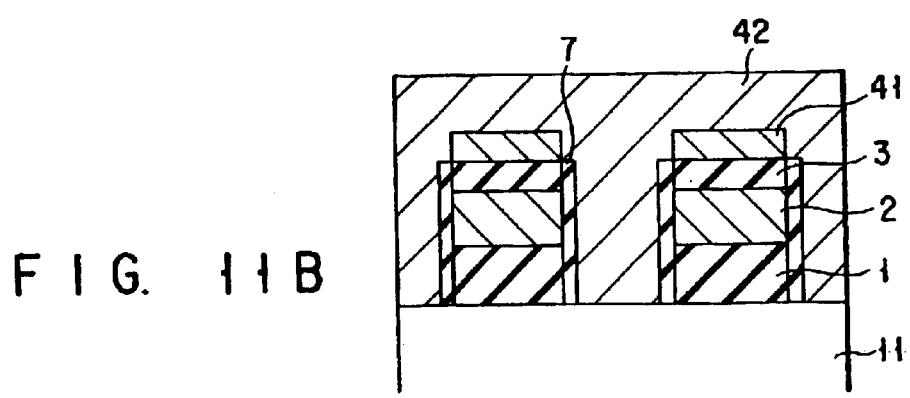
Figure 11C:
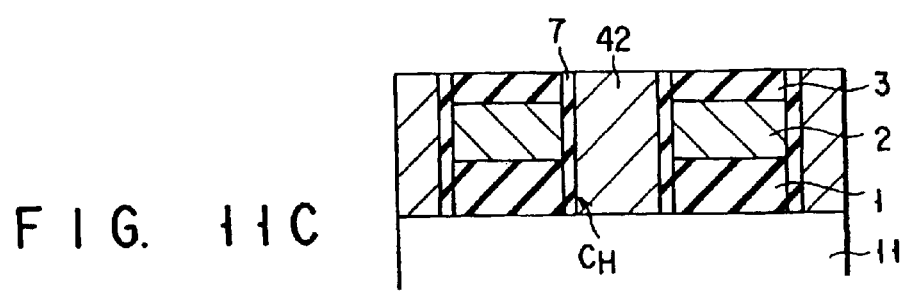
Figure 13:
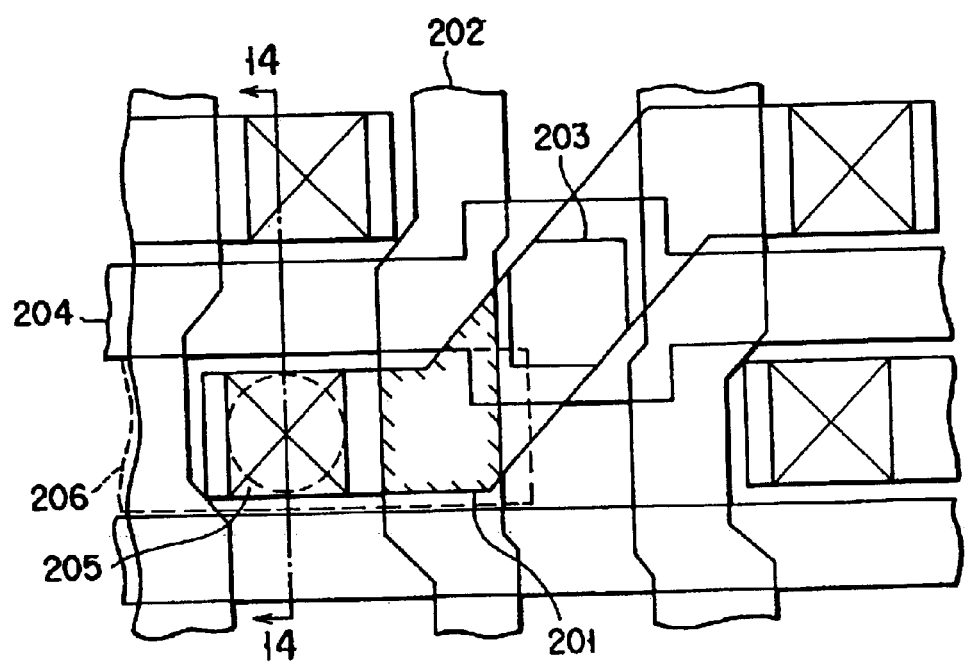
FIG. 13 is a plan view which shows a conventional memory cell.
Figure 14A:
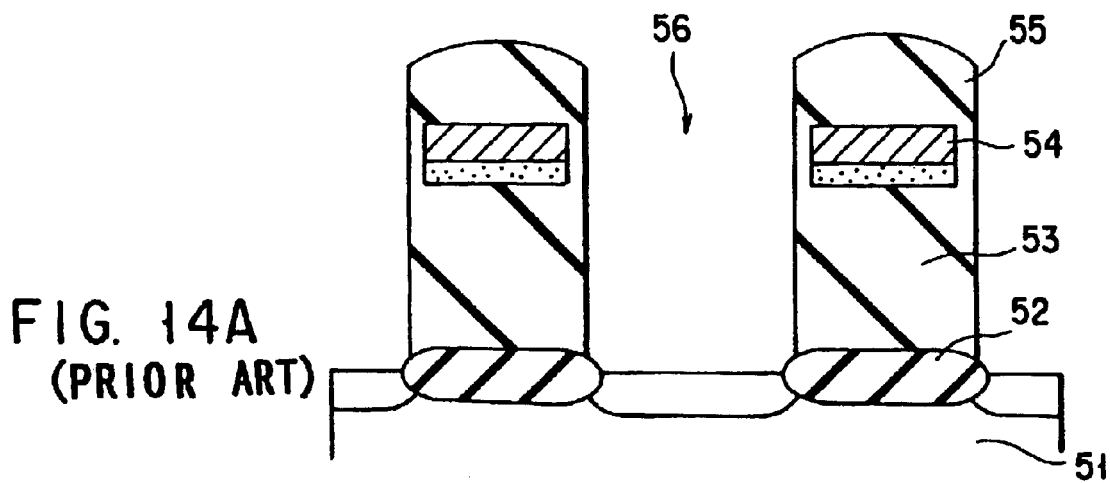
FIGS. 14A through 14C show the steps of manufacturing the conventional memory cell, more specifically, they are cross-sectional views taken a line 14—14 in FIG. 13.
Figure 14B:
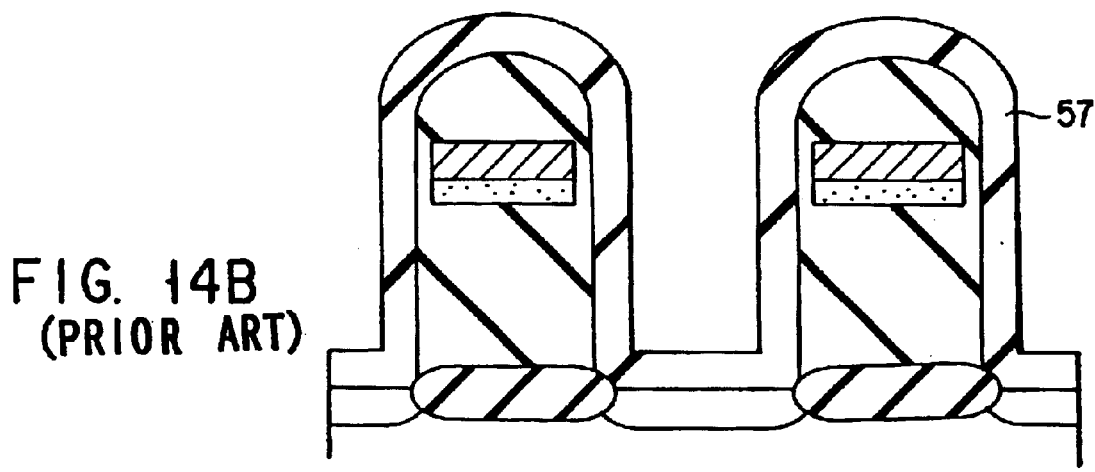
Figure 14C:
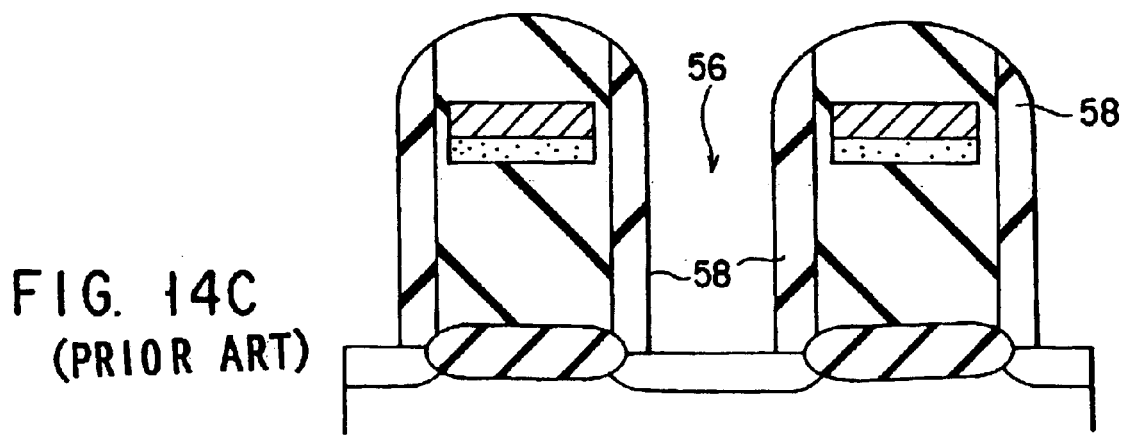
Figure 15A:
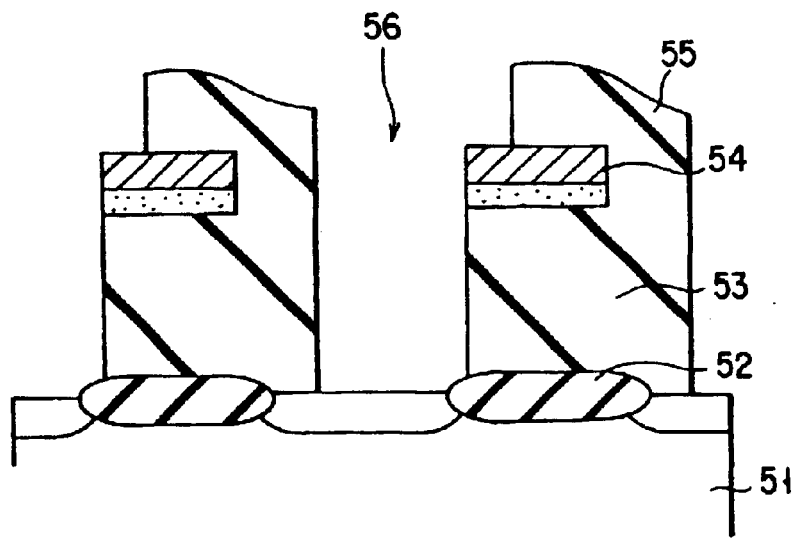
FIGS. 15A through 15C are cross-sectional views witch show problems of the conventional memory cell.
Figure 15B:
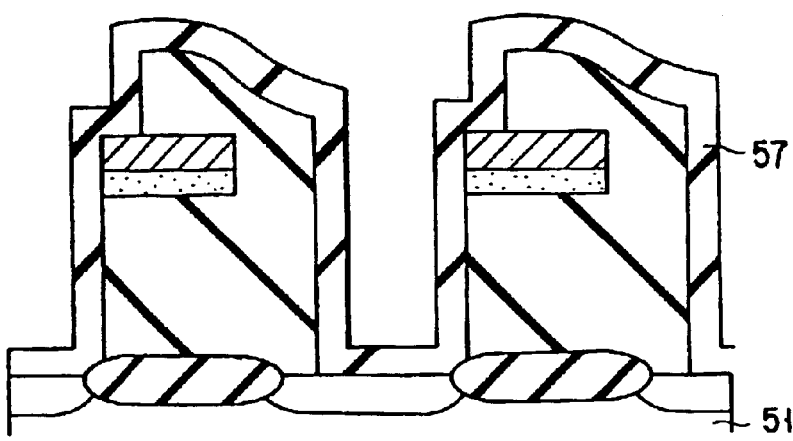
Figure 15C:
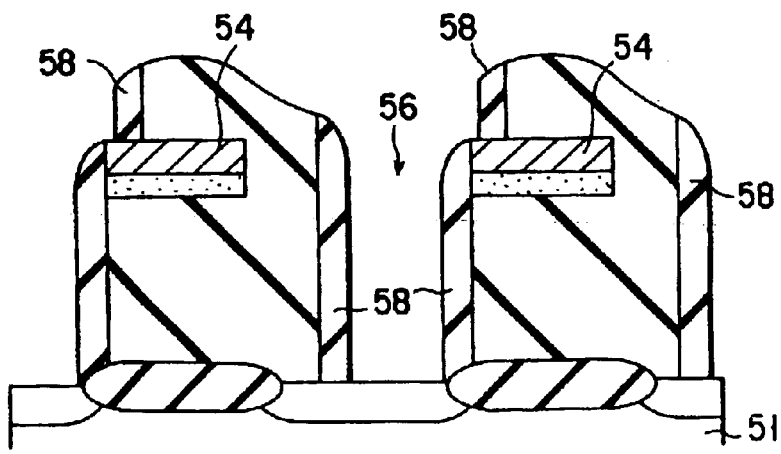

FIGS. 11A through 11C show a sixth embodiment of the present invention. In the first through fifth embodiments, the third insulating film 4 is provided on the second insulating film 3, but a conductive film can be provided on the second insulating film 3 as long as the conditions (1) and (2) are satisfied. In the sixth embodiment, a polysilicon film 41 is provided on the second insulating film 3. Since the polysilicon film 41 has a higher selectivity with the silicon oxide film, like the first through fourth embodiments, when the silicon oxide film 5 is etched, the wiring can be protected. However, since the polysilicon film 41 has conductivity, it should be removed in order to avoid a short-circuit with another film.

Therefore, as shown in FIG. 11A, the fifth insulating film 7 formed on the side wall of the polysilicon film 41 is removed like the fifth embodiment. Next, as shown in FIG. 11B, a polysilicon film 42 is deposited on the whole surface. Thereafter, as shown in FIG. 11C, the polysilicon films 41 and 42 are removed by the CMP method, and the contact hole is plugged up by the polysilicon film 42. At this time, the silicon oxide film 3 functions as a stopper. The same effects as the fifth embodiment can be obtained in the present embodiment.

FIG. 12 shows a seventh embodiment of the present invention, more specifically, a modification of the sixth embodiment. In the present embodiment, a ruthenium film 43, for example, is formed on the second insulating film 3, and a ruthenium film 44 is deposited on the whole surface. Next, in order to manufacture an electrode, the ruthenium film 44 is etched by using a predetermined pattern, and the ruthenium film 44 and the ruthenium film 43 are removed.

The film on the second insulating film 3 and the film deposited on the whole surface are made of ruthenium. For this reason, when manufacturing an electrode, even if the pattern is slightly misaligned as shown in FIG. 12, no problem arises.

In addition, the material of the film on the second insulating film 3 is not limited to ruthenium, so a metallic film, for example, which is similar to the film 44 deposited on the whole surface may be used as long as the aforementioned conditions (1) and (2) are satisfied.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device comprising the steps of:
   forming a first insulating film on a semiconductor substrate;
   forming a conductive film on the first insulating film;
   forming a protective film on said conductive film;
   etching the protective film and conductive film locally and forming first and second wirings;
   forming a second insulating film between the first and second wirings;
   forming a linear/space photo-resist on the first wiring, the second wiring and the second insulating film, which intersects perpendicularly to said first and second wirings;
   etching said second and first insulating films using said photo-resist and said protective film as a mask to form a contact hole between the first and second wirings and outer sides of the first and second wirings; and
   forming a third insulating film at least on a side wall of the conductive film and on a side wall of the first insulating film in the contact hole.

2. The method according to claim 1, wherein said step of forming said second insulating film between said first and second wirings comprises the steps of:
   depositing said second insulating film on a whole surface; and
   etching said second insulating film up to an upper surface of said protective film and removing it and planarizing the surface.

3. The method according to claim 1, wherein said protective film is composed of a silicon nitride film, and said method further comprises removing the silicon nitride film after said third insulating film is formed.

4. The method according to claim 1, wherein said protective film is composed of one of a second conductive film and a metallic film, and said method further comprises removing said one of the second conductive film and the metallic film after said third insulating film is formed.

5. The method according to claim 1, wherein said protective film is composed of a second conductive film, said method further comprising:
   forming a third conductive film on said second conductive film, said second insulating film and in said contact hole after said third insulating film is formed; and
   back etching said third conductive film and said second conductive film and removing said second conductive film and filling up said contact hole with said third conductive film.

6. The method according to claim 1, wherein said protective film is composed of a second conductive film, said method further comprising:
   forming a third conductive film on said second conductive film, said second insulating film and in said contact hole after said third insulating film is formed; and
   etching and removing a portion of said third conductive film and said second conductive film when said third conductive film is patterned by using a predetermined storage node electrode pattern.

7. The method according to claim 1, wherein said contact hole is a square whose side has a minimum dimension.

8. A method of manufacturing a semiconductor device comprising the steps of:
   forming a first insulating film on a semiconductor substrate;
   forming a conductive film on the first insulating film;
   forming a protective film on said conductive film;
   etching the protective film and conductive film locally and forming first and second wirings;
   forming a second insulating film between the first and second wirings;
   forming a linear/space photo-resist on the first wiring, the second wiring and the second insulating film, which intersects perpendicularly to said first and second wirings;
   etching said second and first insulating films using said photo-resist and said protective film as a mask to form a contact hole between the first and second wirings; and
   forming a third insulating film at least on a side wall of the conductive film and on a side wall of the first insulating film in the contact hole.

9. The method according to claim 8, wherein said step of forming said second insulating film between said first and second wirings comprises the steps of:
   depositing said second insulating film on a whole surface; and
   etching said second insulating film up to an upper surface of said protective film and removing it and planarizing the surface.

10. The method according to claim 8, wherein said protective film is composed of a silicon nitride film, and said method further comprises removing the silicon nitride film after said third insulating film is formed.

11. The method according to claim 8, wherein said protective film is composed of one of a second conductive film and a metallic film, and said method further comprises removing said one of the second conductive film and the metallic film after said third insulating film is formed.

12. The method according to claim 8, wherein said protective film is composed of a second conductive film, said method further comprising:

forming a third conductive film on said second conductive film, said second insulating film and in said contact hole after said third insulating film is formed; and back etching said third conductive film and said second conductive film and removing said second conductive film and filling up said contact hole with said third conductive film.

13. The method according to claim 8, wherein said protective film is composed of a second conductive film, said method further comprising:

forming a third conductive film on said second conductive film, said second insulating film and in said contact hole after said third insulating film is formed; and etching and removing a portion of said third conductive film and said second conductive film when said third conductive film is patterned by using a predetermined storage node electrode pattern.

14. The method according to claim 8, wherein said contact hole is a square whose side has a minimum dimension.

* * * * *